United States Patent
Price et al.

(10) Patent No.: US 7,467,363 B2
(45) Date of Patent: Dec. 16, 2008

(54) METHOD FOR SRAM BITMAP VERIFICATION

(75) Inventors: David T. Price, Gresham, OR (US); Jayashree Kalpathy-Cramer, West Linn, OR (US); Mark Ward, West Linn, OR (US)

(73) Assignee: LSI Corporation, Milpitas, CA (US)

( * ) Notice: Subject to any disclaimer, the term of this patent is extended or adjusted under 35 U.S.C. 154(b) by 349 days.

(21) Appl. No.: 11/246,880

(22) Filed: Oct. 7, 2005

(65) Prior Publication Data

US 2007/0083834 A1     Apr. 12, 2007

(51) Int. Cl.
G06F 17/50 (2006.01)
(52) U.S. Cl. .............................................. 716/4; 716/5
(58) Field of Classification Search ................. 716/4–5, 716/11; 703/14–15; 365/200–201, 49; 714/5, 714/42, 718–720, 723–724, 730, 732, 741; 702/112
See application file for complete search history.

(56) References Cited

U.S. PATENT DOCUMENTS 5,884,065 A * 3/1999 Takasaki ....................... 703/14
6,510,533 B1 * 1/2003 Siek et al. ..................... 714/719
2004/0205681 A1 * 10/2004 Nozuyama ..................... 716/4
2006/0005094 A1 * 1/2006 Nozuyama ................. 714/738

* cited by examiner

Primary Examiner—Paul Dinh
(74) Attorney, Agent, or Firm—Trexler, Bushnell, Giangiorgi, Blackstone, & Marr Ltd.

(57) ABSTRACT

A method for verifying that a physical location of a memory matches a design logical representation, without having to use a focused ion beam to physically damage a memory location. The method provides that either a temporary or permanent circuit "defect" is intentionally created in the physical layout. Then, the new electrical schematic is extracted from the modified physical layout. Subsequently, if the design "defect" which was created is temporary, the new electrical schematic is simulated, the logical address of the "defect" is determined, and the extracted logical address is compared to the expected address to verify the logical to physical correlation. Alternatively, if the design "defect" which was created is permanent, after the new electrical schematic is extracted from the modified physical layout, the product is fabricated and the known design "defect" location is used to correlate to the electrically-tested defect logical location.

12 Claims, 3 Drawing Sheets

METHOD FOR SRAM BITMAP VERIFICATION

BACKGROUND

The present invention generally relates to methods for performing failure analysis of semiconductor memory, and more specifically relates to a method for performing logical to physical verification of semiconductor memory by intentionally creating an electrical design "defect" within the physical representation of a design layout.

During the failure analysis of semiconductor memory, it is necessary to know the physical location of a failing memory bit, but typically what is available from the design is merely the design logical representation of the failing bit. Once the logical location is determined, a scramble equation is used to identify the physical location of the failing bit, based on the logical location. As such, the scramble equation effectively converts the logical location to the physical location of the failing bit. However, often there are errors in the scramble mapping. As a result, there is a need to physically verify that the determined physical location is correct. If this verification is not performed, then failure analysis will subsequently be performed on the incorrect memory location, incurring extra delays and costs.

Currently, the typical method to verify that the calculated physical location is correct is to use a focused ion beam (FIB) to physically damage that particular memory location and then retest it. FIG. 1 provides a flow diagram which illustrates the typical method in more detail. As shown, the process is started (bubble 100 in FIG. 1) and initially a package unit, such as a flip-chip package, is decapped (block 102 in FIG. 1). Then, design layout CAD files are accessed to identify circuitry in the memory area of interest (block 104 in FIG. 1). Then, a focused ion beam (FIB) and the CAD software are used to navigate through the backside of the silicon and physically damage the identified location (block 106 in FIG. 1). Subsequently, electrical verification is performed on the Automated Test Equipment (ATE) to confirm that the electrical address matches the physical site which was damaged using the focused ion beam (block 108 in FIG. 1). If the electrical results indicate that the electrical address matches the physical site which was damaged (diamond 110 in FIG. 1), the process is ended (bubble 112 in FIG. 1). Otherwise, the focused ion beam (FIB) and the CAD software are used to navigate through the backside of the silicon and physically damage another location (block 106 in FIG. 1), and electrical verification is again performed on the Automated Test Equipment (ATE) to confirm that the electrical address matches the physical site which was damaged using the focused ion beam (block 108 in FIG. 1), and so on.

The disadvantages of using a focused ion beam to physically damage memory locations in order to verify that a calculated physical location matches a design logical representation include, but may not be limited to, the following: the process is costly; it takes a long time to make the focused ion beam cut, and the focused ion beam is typically a limited availability tool; the package trend for complex ASIC designs is to use flip-chip packaging, and using a focused ion beam to navigate through the backside of the silicon and physically damage a memory location is difficult and may require several attempts; and if the electrical re-test result does not correspond with the damaged location, then this operation may be required to be repeated over several iterations (and possibly several new units) causing costly delays and engineering resources.

OBJECTS AND SUMMARY

An object of an embodiment of the present invention is to provide an improved method for verifying that a physical location of a memory matches a design logical representation.

Another object of an embodiment of the present invention is to provide a method for verifying that a physical location of a memory matches a design logical representation, without having to use a focused ion beam to physically damage a memory location.

Briefly, and in accordance with at least one of the foregoing objects, an embodiment of the present invention provides a method for verifying that a physical location of a memory matches a design logical representation. The method provides that either a temporary or permanent design "defect" is intentionally created in the physical layout. Then, the new electrical schematic is extracted from the modified physical layout. Subsequently, if the design "defect" which was created is temporary, the new electrical schematic is simulated, the logical address of the "defect" is determined, and the extracted logical address is compared to the expected address to verify the logical to physical correlation. Alternatively, if the design "defect" which was created is permanent, after the new electrical schematic is extracted from the modified physical layout, the product is fabricated and the known design "defect" location is used to correlate to the electrically-tested defect logical location.

BRIEF DESCRIPTION OF THE DRAWINGS

The organization and manner of the structure and operation of the invention, together with further objects and advantages thereof, may best be understood by reference to the following description, taken in connection with the accompanying drawings, wherein.

DESCRIPTION

Figure 1:
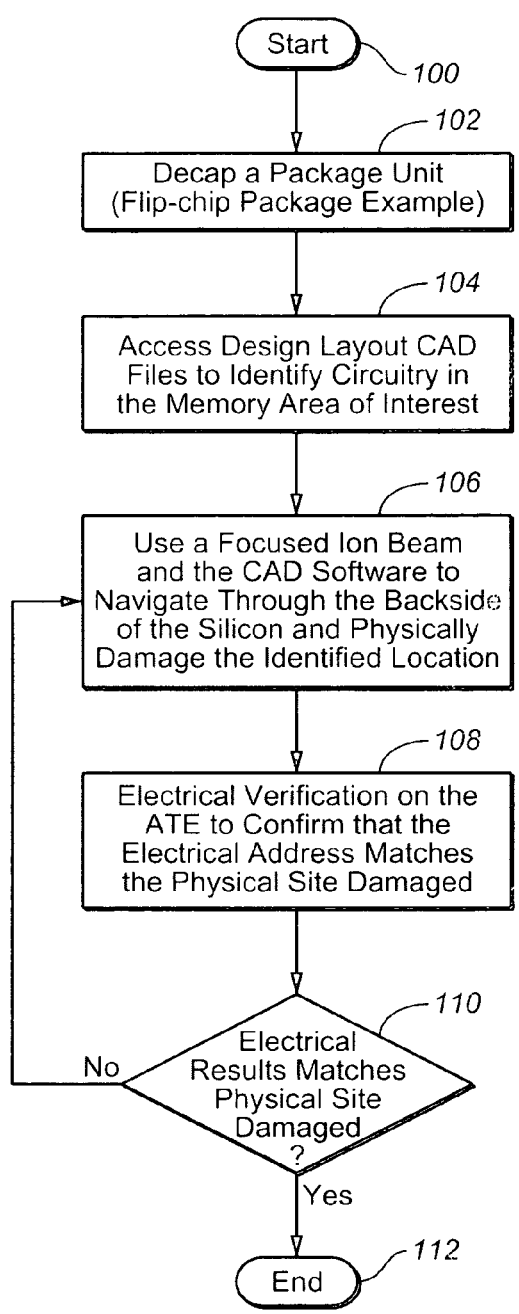
FIG. 1 provides a flow diagram which illustrates a prior art method of verifying that a physical location matches a design logical representation.

While the invention may be susceptible to embodiment in different forms, there are shown in the drawings, and herein will be described in detail, specific embodiments of the invention. The present disclosure is to be considered an example of the principles of the invention, and is not intended to limit the invention to that which is illustrated and described herein.

The present invention provides an improved method for verifying that a physical location of a memory matches a design logical representation, without having to use a focused ion beam to physically damage a memory location.

Figure 2:
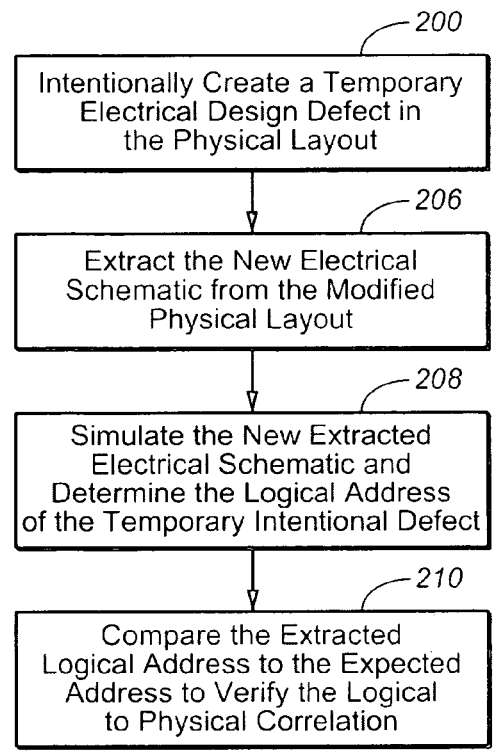
FIG. 2 provides a flow diagram which illustrates a method of verifying that a physical location matches a design logical representation, wherein the method is in accordance with an embodiment of the present invention.
Figure 4:
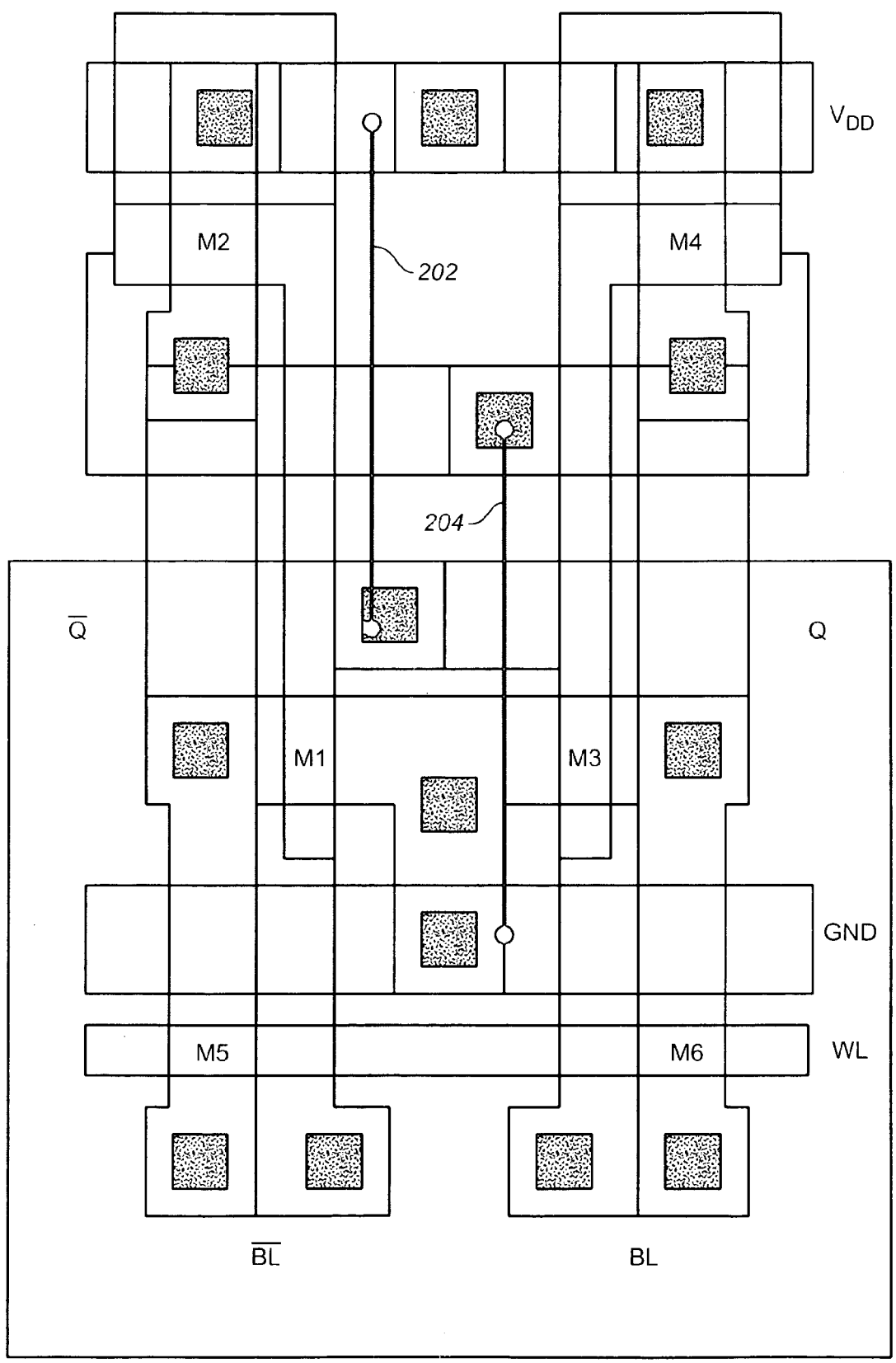
FIG. 4 illustrates a physical layout of a design, showing two different types of electrical design "defects" which can be intentionally created in connection with the methods of FIGS. 2 and 3.
Figure 5:
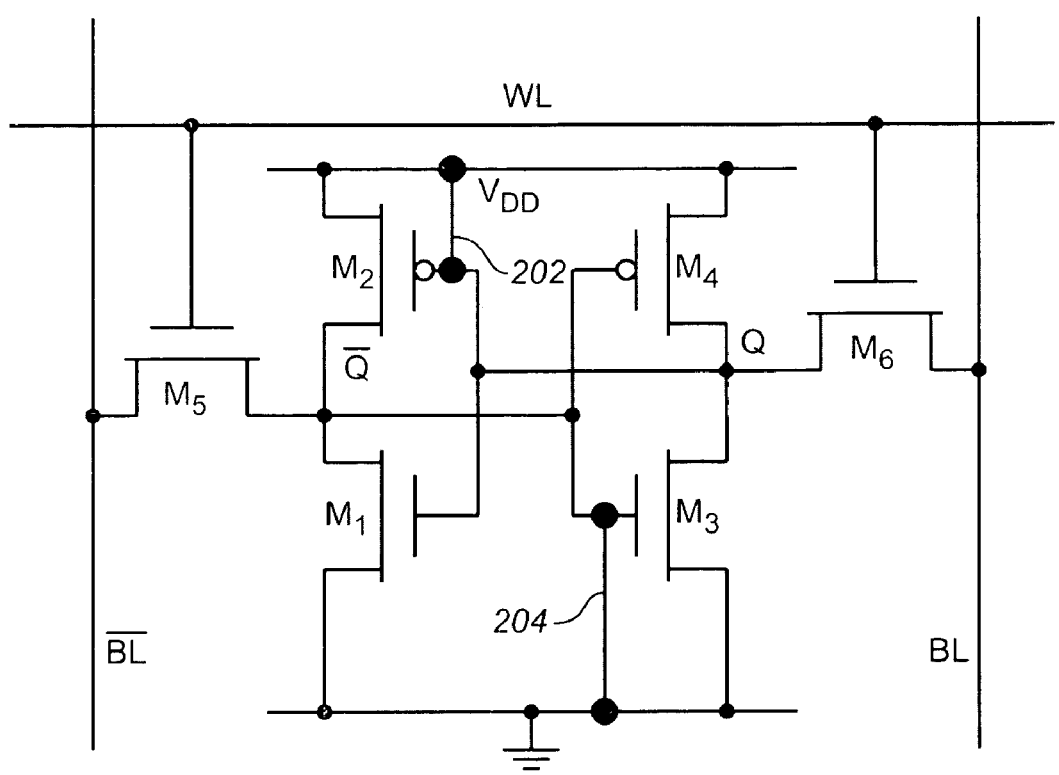
FIG. 5 illustrates an electrical schematic which corresponds to the physical layout shown in FIG. 4, including the two electrical design "defects" which have been intentionally created in connection with the methods of FIGS. 2 and 3.

FIG. 2 illustrates a method which is in accordance with an embodiment of the present invention. As shown, a temporary electrical design "defect" is intentionally created in the physical layout (block 200 in FIG. 2). FIG. 4 illustrates two different types of electrical design "defects" which can be intentionally created, specifically a connection of a node to Vdd (power) (line 202 in FIGS. 4 and 5) or Vss (ground) (line 204 in FIGS. 4 and 5). Once the electrical design "defect" is created, the new electrical schematic (illustrated in FIG. 5) is extracted from the modified physical layout (block 206 in FIG. 2). Subsequently, the new electrical schematic is simulated, and the logical address of the "defect" is determined (block 208 in FIG. 2). Finally, extracted logical address is compared to the expected address to verify the logical to physical correlation (block 210 in FIG. 2) (i.e., test pattern verification through the modified design attempting to confirm the expected logical to physical conversion).

Figure 3:
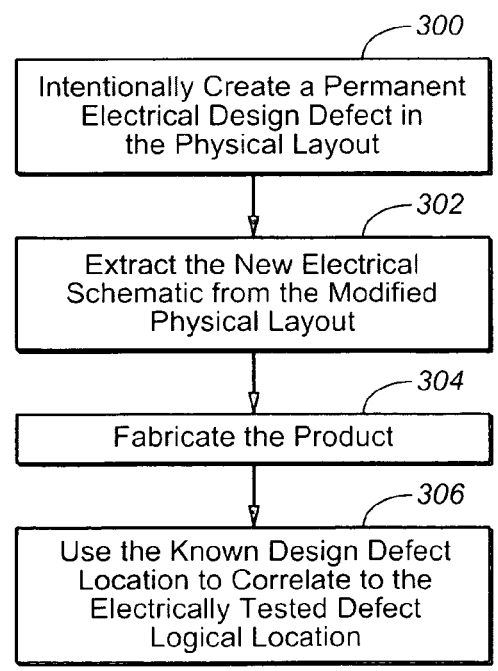
FIG. 3 provides a flow diagram which illustrates a method of verifying that a physical location matches a design logical representation, wherein the method is in accordance with an alternative embodiment of the present invention.

The method illustrated in FIG. 3 is similar to that which is illustrated in FIG. 2, except in the method illustrated in FIG. 3, the electrical design "defect" which is intentionally created is permanent (block 300 in FIG. 3). The method provides that after the new electrical schematic (see FIG. 5) is extracted from the modified physical layout (see FIG. 4) (block 302 in FIG. 3), the product is fabricated (block 304 in FIG. 3) and the known design "defect" location is used to correlate to the electrically-tested defect logical location (block 306 in FIG. 2).

Regardless of whether the electrical design "defect" which is intentionally created is temporary or permanent, the method eliminates the need to use a focused ion beam and navigate through the backside of silicon to physically damage an identified location, perhaps more than once.

While embodiments of the present invention are shown and described, it is envisioned that those skilled in the art may devise various modifications of the present invention without departing from the spirit and scope of the appended claims.

What is claimed is:

1. A method of verifying that a physical location of a memory matches a design logical representation, said method comprising: providing a physical representation of a design layout; intentionally creating an electrical design defect within the physical representation of the design layout, thereby providing a modified physical layout which is different from the physical representation of the design layout and includes the electrical design defect which was intentionally created after the physical representation of the design layout was provided; extracting an electrical schematic from the modified physical layout; and performing test pattern verification using the extracted electrical schematic.

2. A method as recited in claim 1, further comprising intentionally creating a temporary defect.

3. A method as recited in claim 1, further comprising intentionally creating a permanent defect.

4. A method as recited in claim 1, wherein the defect which is intentionally created comprises connecting a node to Vdd.

5. A method as recited in claim 1, wherein the defect which is intentionally created comprises connecting a node to Vss.

6. A method as recited in claim 1, further comprising intentionally creating a temporary defect, wherein the defect which is intentionally created comprises connecting a node to Vdd.

7. A method as recited in claim 1, further comprising intentionally creating a temporary defect, wherein the defect which is intentionally created comprises connecting a node to Vss.

8. A method as recited in claim 1, further comprising intentionally creating a permanent defect, wherein the defect which is intentionally created comprises connecting a node to Vdd.

9. A method as recited in claim 1, further comprising intentionally creating a permanent defect, wherein the defect which is intentionally created comprises connecting a node to Vss.

10. A method as recited in claim 1, further comprising determining a logical address of the defect which was intentionally created.

11. A method as recited in claim 1, further comprising determining a logical address of the defect, and comparing an extracted logical address to an expected address to verify the logical to physical correlation.

12. A method as recited in claim 1, further comprising fabricating a product, and using a known design defect location to correlate to an electrically-tested defect logical location.

* * * * *